(12) United States Patent
Hussell et al.

(10) Patent No.: US 8,564,000 B2
(45) Date of Patent: Oct. 22, 2013

(54) LIGHT EMITTING DEVICES FOR LIGHT EMITTING DIODES (LEDS)

(75) Inventors: Christopher P. Hussell, Cary, NC (US); Peter Scott Andrews, Durham, NC (US); Jesse Colin Reiherzer, Wake Forest, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 64 days.

(21) Appl. No.: 13/028,972

(22) Filed: Feb. 16, 2011

(65) Prior Publication Data

US 2012/0126255 A1 May 24, 2012

Related U.S. Application Data

(63) Continuation-in-part of application No. 29/379,636, filed on Nov. 22, 2010, now Pat. No. Des. 650,760.

(60) Provisional application No. 61/416,184, filed on Nov. 22, 2010.

(51) Int. Cl.
*H01L 33/40* (2010.01)
(52) U.S. Cl.
USPC ............. 257/98; 257/99; 257/100; 257/431; 257/E21.592
(58) Field of Classification Search
USPC ................. 257/12–13, 98–100, 431–433; 438/27–28
See application file for complete search history.

(56) References Cited

U.S. PATENT DOCUMENTS

| | | |
|---|---|---|
| 34,861 A | 4/1862 | Knowlton et al. |
| 4,946,547 A | 8/1990 | Palmour |
| 5,200,022 A | 4/1993 | Kong |
| RE34,861 E | 2/1995 | Davis et al. |
| 6,548,832 B1 | 4/2003 | Sakamoto et al. |
| 7,224,000 B2 | 5/2007 | Aanegola et al. |
| D570,797 S | 6/2008 | Song |
| D573,553 S | 7/2008 | Uemoto et al. |
| D576,576 S | 9/2008 | Shida et al. |
| 7,482,636 B2 | 1/2009 | Murayama et al. |
| D589,470 S | 3/2009 | Chen |
| D591,248 S | 4/2009 | Imai et al. |
| D593,043 S | 5/2009 | Song |

(Continued)

FOREIGN PATENT DOCUMENTS

| | | |
|---|---|---|
| CN | ZL 2011-30139847.5 | 8/2012 |
| CN | ZL 2011-30166527.9 | 8/2012 |

(Continued)

OTHER PUBLICATIONS

U.S. Appl. No. 13/104,558 for "Light Emitting Devices and Methods" filed May 10, 2011.

(Continued)

*Primary Examiner* — Dung A. Le
(74) *Attorney, Agent, or Firm* — Jenkins, Wilson, Taylor & Hunt, P.A.

(57) ABSTRACT

Light emitting devices for light emitting diodes (LEDs) are disclosed. In one embodiment a light emitting device can include a substrate, one or more LEDs disposed over the substrate, and the LEDs can include electrical connectors for connecting to an electrical element. A light emitting device can further include a retention material disposed over the substrate and the retention material can be disposed over at least a portion of the electrical connectors. The LEDs can be connected in a pattern that is non-linear.

33 Claims, 9 Drawing Sheets

(56) References Cited

U.S. PATENT DOCUMENTS

| | | | |
|---|---|---|---|
| D602,451 S | 10/2009 | Gielen | |
| D603,813 S | 11/2009 | Nishimura et al. | |
| D607,420 S | 1/2010 | Imai et al. | |
| 7,649,209 B2 | 1/2010 | Hussell et al. | |
| D615,052 S | 5/2010 | Imai et al. | |
| D618,635 S | 6/2010 | Imai et al. | |
| 7,825,578 B2 | 11/2010 | Takashima et al. | |
| 7,872,418 B2 | 1/2011 | Hata et al. | |
| D637,564 S | 5/2011 | Tseng et al. | |
| 7,994,518 B2 | 8/2011 | Wang et al. | |
| D645,417 S | 9/2011 | Imai et al. | |
| 8,044,418 B2 | 10/2011 | Loh et al. | |
| 8,058,088 B2 | 11/2011 | Cannon | |
| D650,760 S | 12/2011 | Hussell et al. | |
| D667,803 S | 9/2012 | Hussell et al. | |
| D676,000 S | 2/2013 | Hussell et al. | |
| D676,395 S | 2/2013 | Hussell et al. | |
| 2004/0196663 A1 | 10/2004 | Ishida et al. | |
| 2006/0186418 A1 | 8/2006 | Edmond | |
| 2007/0018295 A1 | 1/2007 | Kim et al. | |
| 2007/0029569 A1 | 2/2007 | Andrews | |
| 2007/0158668 A1 | 7/2007 | Tarsa | |
| 2008/0054279 A1 | 3/2008 | Hussell et al. | |
| 2008/0054284 A1 | 3/2008 | Hussell et al. | |
| 2008/0054286 A1 | 3/2008 | Loh et al. | |
| 2008/0173884 A1 | 7/2008 | Chitnis | |
| 2008/0179611 A1 | 7/2008 | Chitnis | |
| 2008/0224166 A1 | 9/2008 | Glovatsky et al. | |
| 2008/0258130 A1 | 10/2008 | Bergmann | |
| 2009/0261374 A1 | 10/2009 | Hayashi | |
| 2009/0289169 A1 | 11/2009 | Yang et al. | |
| 2009/0315061 A1 | 12/2009 | Andrews | |
| 2010/0078664 A1 | 4/2010 | Helbing | |
| 2010/0141182 A1 | 6/2010 | Shi | |
| 2010/0155763 A1 | 6/2010 | Donofrio | |
| 2010/0253248 A1 | 10/2010 | Shi | |
| 2010/0270567 A1 | 10/2010 | Emerson et al. | |
| 2010/0320483 A1 | 12/2010 | Kadotani et al. | |
| 2011/0128730 A1 | 6/2011 | Chiu | |
| 2011/0291151 A1 | 12/2011 | Matsuda et al. | |
| 2012/0126257 A1 | 5/2012 | Reiherzer et al. | |
| 2012/0193651 A1 | 8/2012 | Edmond | |
| 2012/0205689 A1 | 8/2012 | Welch | |
| 2012/0299022 A1 | 11/2012 | Hussell | |

FOREIGN PATENT DOCUMENTS

| | | |
|---|---|---|
| CN | ZL201230099913.5 | 11/2012 |
| CN | ZL201230099954.4 | 12/2012 |
| CN | ZL201230099981.1 | 12/2012 |
| EP | 2327930 | 6/2011 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-323857 | 12/2007 |
| JP | 2007-335371 | 12/2007 |
| JP | 2009-289918 | 1/2008 |
| JP | 2009-044055 | 2/2009 |
| JP | 2010-009972 | 1/2010 |
| KR | 10-0793338 | 1/2008 |
| KR | 10-2008-0092239 | 10/2008 |
| KR | 10-2009-0011121 | 3/2009 |
| KR | 10-2011-0004632 | 1/2011 |
| TW | 113260 | 10/2006 |
| TW | 124444 | 8/2008 |
| TW | 128526 | 5/2009 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |

OTHER PUBLICATIONS

Notice of Allowance for U.S. Appl. No. 29/379,636 dated Aug. 4, 2011.
U.S. Appl. No. 29/404,913 for "Light Emitting Device Component" filed Oct. 26, 2011.
U.S. Appl. No. 13/224,850 for "Light Emitting Device Component" filed Sep. 2, 2011.
U.S. Appl. No. 29/379,636 for "Light Emitting Device Package" filed Nov. 22, 2011.
U.S. Appl. No. 29/408,955 for "Light Emitting Device Package" filed Dec. 19, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
Bridgelux Product Data Sheet—1 page http://www.bridgelux.com/products/ledarray.html at least as early as Nov. 18, 2010.
Citizen Co. Product Data Sheet—http://ce.citizen.co.ip/lighting_led/en/products/index.html (4 pages) at least as early as Dec. 1, 2010.
U.S. Appl. No. 29/379,636 for "Light Emitting Device Package" filed Nov. 22, 2010.
U.S. Appl. No. 29/380,387 for "Light Emitting Device Package" filed Dec. 3, 2010.
Patent Application for U.S. Appl. No. 13/336,540 dated Dec. 23, 2011.
International Search Report and Written Opinion for Application Serial No. PCT/US2011/058596 dated Jun. 18, 2012.
Chinese Office Action for Application Serial No. CN2012/30130915.6 dated Jul. 12, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 7, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for Application No. 13/104,558 dated Jan. 3, 2013.
International Search Report and Written Opinion for Application No. PCT/US2012/070589 dated Apr. 22, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.

(56) References Cited

OTHER PUBLICATIONS

Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.

LIGHT EMITTING DEVICES FOR LIGHT EMITTING DIODES (LEDS)

CROSS REFERENCE TO RELATED APPLICATIONS

This application relates to and claims the benefit of and priority to U.S. Provisional Patent Application Ser. No. 61/416,184, filed Nov. 22, 2010, and is a continuation-in-part of and claims priority to U.S. Design patent application Ser. No. 29/379,636, entitled Light Emitting Device Package filed Nov. 22, 2010 now U.S. Pat. No. D,650,760. The disclosures of both of these prior applications are hereby incorporated by reference in their entireties.

TECHNICAL FIELD

The subject matter disclosed herein relates generally to light emitting devices and methods. More particularly, the subject matter disclosed herein relates to light emitting devices and methods comprising at least one pattern and/or array of light emitting diodes (LEDs).

BACKGROUND

Light emitting devices, such as light emitting diodes (LEDs), may be utilized in packages for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm, for example. A viewer perceives the mixture of light emissions as white light. As an alternative to phosphor converted white light, light emitting devices of red, green, and blue (RGB) wavelengths can be combined in one device or package or device to produce light that is perceived as white.

Despite availability of various LED devices and methods in the marketplace, a need remains for improved devices and improved manufacturability of devices suitable for industrial and commercial lighting products and replacement of conventional light sources, such as for example, 50 to 100 watt HID and high wattage compact fluorescent (CFL) lamps, outdoor lighting products, home luminaires, and retrofit light bulbs. LED devices and methods described herein can advantageously enhance light output performance while promoting ease of manufacture.

SUMMARY

In accordance with this disclosure, novel light emitting devices and methods are provided that are well suited for a variety of applications, including industrial and commercial lighting products. It is, therefore, an object of the present disclosure herein to provide light emitting devices and methods comprising at least one pattern, arrangement, and/or array of light emitting devices optimized to enhance light output performance while providing energy savings.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
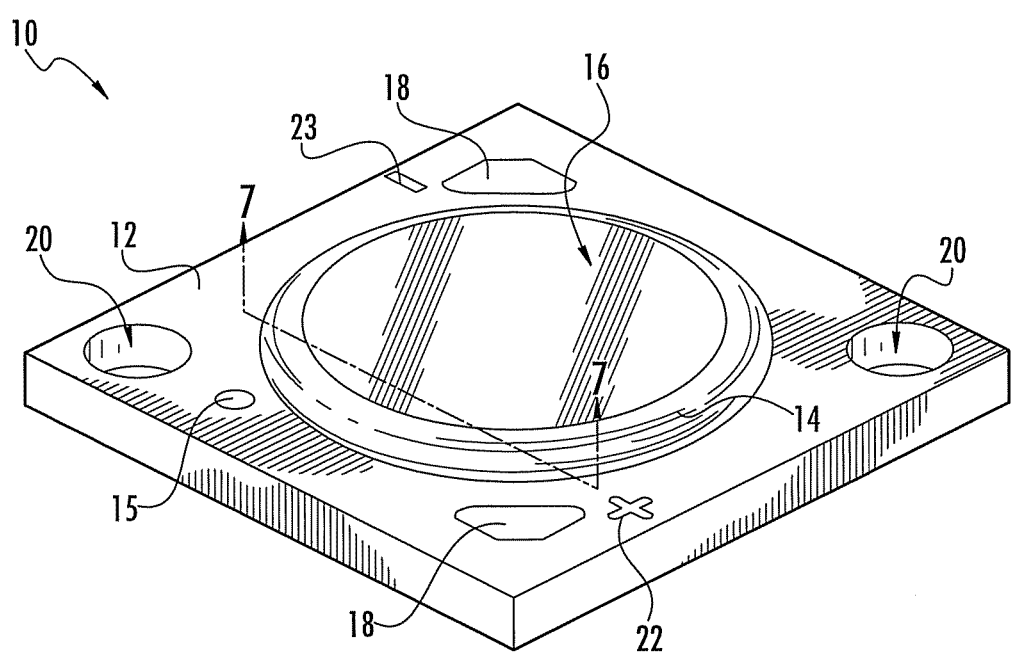
FIG. 1 illustrates a top perspective view of an embodiment of a light emitting device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

An LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. An LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

Figure 6:
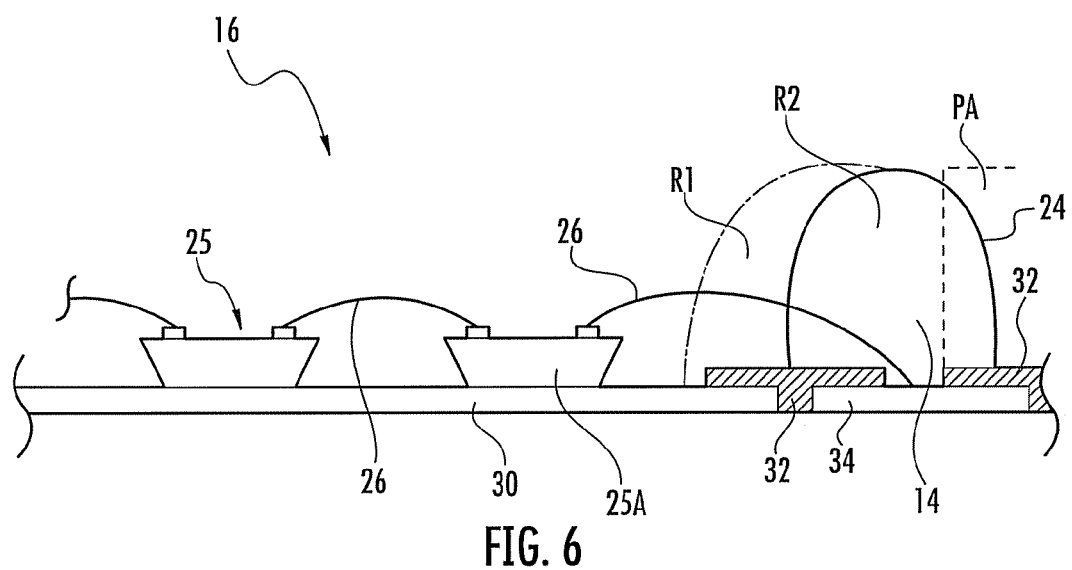
FIG. 6 illustrates a first cross-sectional view of a light emission area of a light emitting device according to the disclosure herein.
Figure 7:
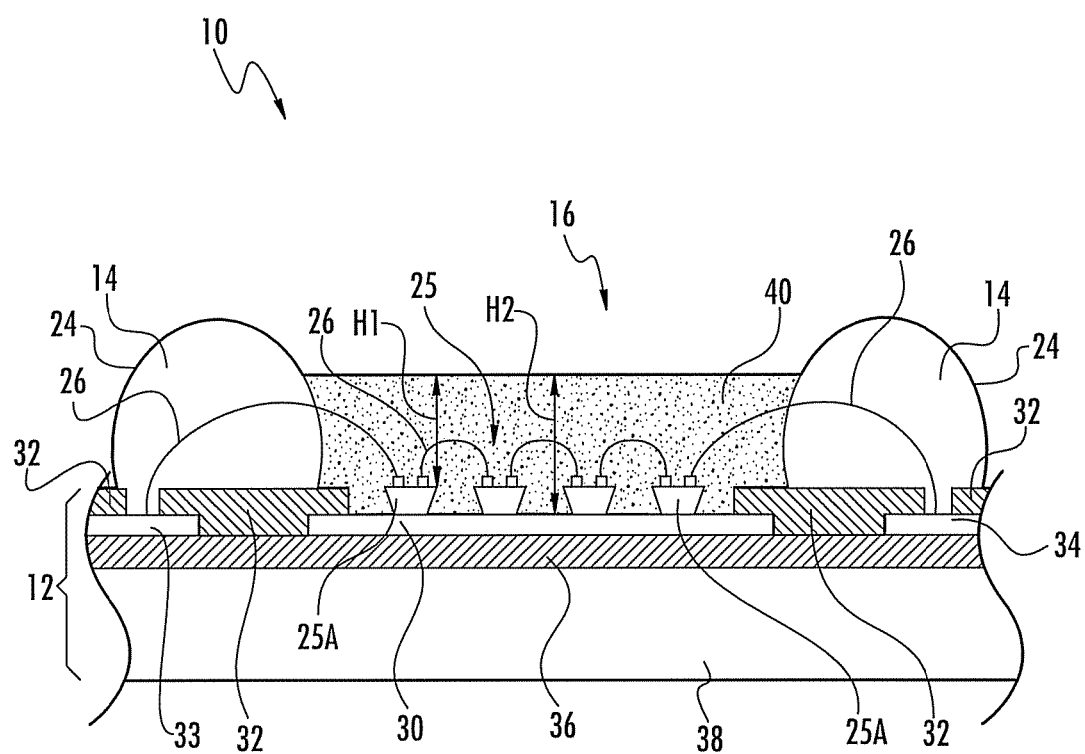
FIG. 7 illustrates a second cross-sectional view of a light emission area of a light emitting device according to the disclosure herein.
Figure 8:
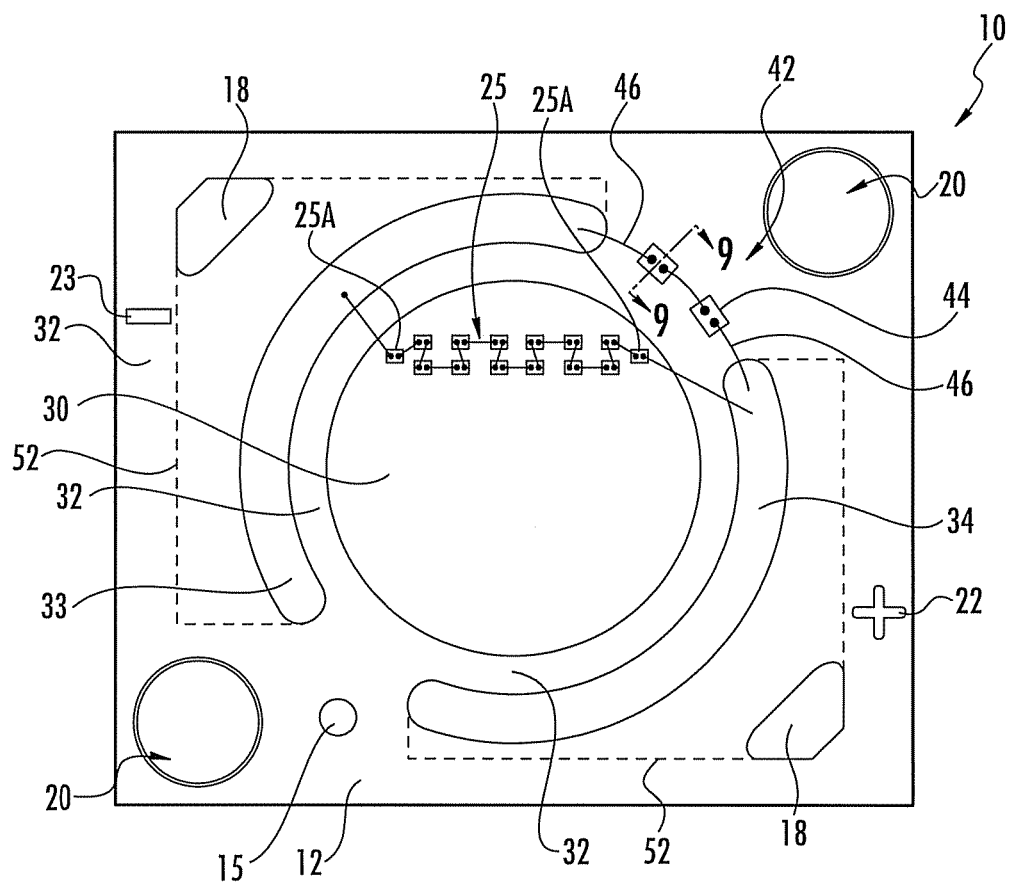
FIG. 8 illustrates a top view of a light emitting device according to the disclosure herein.
Figure 9:
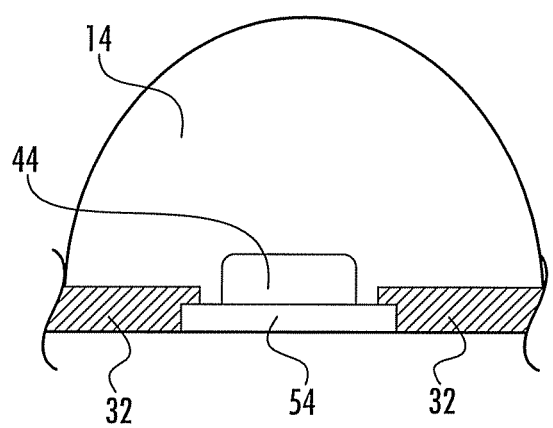
FIG. 9 illustrates a cross-sectional view of a gap area of a light emitting device according to the disclosure herein.

Referring now to FIGS. 1 to 9, FIG. 1 illustrates a top view of a light emitting or LED device, generally designated 10. LED device 10 can comprise a substrate 12 over which an emission area, generally designated 16, can be disposed. In one aspect, emission area 16 can be disposed substantially centrally with, respect to LED device 10. In the alternative, emission area 16 can be disposed in any location over LED device 10, for example, in a corner or adjacent an edge. In one aspect, emission area 16 can comprise a substantially circular shape. In other aspects, emission area 16 can comprise any other suitable shape, for example, a substantially square, oval, or rectangle shape. LED device 10 can comprise a single emission area 16 or more than one emission area 16. Notably, LED device 10 can comprise a uniform optical source in the form of emission area which can simplify the manufacturing process for manufacturers of light products requiring a single component. LED device 10 can further comprise a retention material 14 disposed at least partially about emission area 16 where retention material 14 can be referred to as a dam. Retention material 14 can also be disposed over at least one electrostatic discharge (ESD) protection device, such as a Zener diode 44 (FIG. 9). In some aspects, retention material can be disposed over two Zener diodes 44 connected in series between two electrical elements (FIG. 8).

Substrate 12 can comprise any suitable mounting substrate, for example, a printed circuit board (PCB), a metal core printed circuit board (MCPCB), an external circuit, or any other suitable substrate over which lighting devices such as LEDs may mount and/or attach. Emission area 16 can be in electrical and/or thermal communication with substrate 12. One or more intervening layers can be disposed between emission area 16 and substrate 12 such that emission area 16 is indirectly disposed over substrate 12 thereby indirectly electrically and/or thermally communicating with substrate 12. In the alternative, emission area 16 can directly mount over substrate 12 thereby directly electrically and/or thermally communicating, or connecting, with substrate 12. In one aspect and for example only without limitation, substrate 12 can comprise a compact dimension of 22 millimeter (mm)×22-mm square footprint. In other aspects, substrate 12 can comprise any suitable dimension and/or shape, for example, a circular or rectangular shape.

Emission area 16 can comprise a plurality of LED chips, or LEDs 25 disposed within and/or below a filling material 40 such as illustrated in FIG. 7. LEDs 25 can comprise any suitable size and/or shape. For example, LEDs 25 can have a rectangle, square, or any other suitable shape. In one aspect, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 40 can comprise a molded lens material. Filling material 40 can be substantially opaque such that emission area 16 can be substantially opaque (as illustrated in FIG. 1), transparent, or semi-transparent depending upon, for example, the amount and type of phosphor used. Retention material 14 can be adapted for dispensing, or placing, about at least a portion of emission area 16. After placement of retention material 14, filling material 40 can be selectively filled to any suitable level within the space disposed between one or more inner walls of retention material 14. For example, filling material 40 can be filled to a level equal to the height of retention material 14 or to any level above or below retention material. The level of filling material 40 can be planar or curved in any suitable manner, such as concave or convex.

Still referring to FIG. 1, LED device 10 can also comprise at least one opening or hole, generally designated 20, that can be disposed through or at least partially through substrate 12 for facilitating attachment of LED device 10 to an external substrate or surface. For example, one or more screws can be inserted through the at least one hole 20 for securing device 10 to another member, structure, or substrate. LED device 10 can also comprise one or more electrical attachment surfaces 18. In one aspect, attachment surfaces 18 comprise electrical contacts such as solder contacts. Attachment surfaces 18 can be any suitable configuration, size, shape and/or location and can comprise positive and negative electrode terminals through which an electrical current or signal can pass when connected to an external power source. One or more conducting wires (not shown) can be attached and electrically connected to attachment surfaces 18 when welded, soldered, or any other suitable attachment method known. Electrical current or signal can pass into LED device 10 from the external wires electrically connected to the attachment surfaces 18 and into the emission area 16 to facilitate light output. Attachment surfaces 18 can electrically communicate with emission area 16 which comprises one or more LEDs 25. Attachment surfaces 18 can electrically communicate with first and second conductive traces 33 and 34 (see FIG. 8) and therefore LEDs 25 which may be electrically connected using electrical connectors. Electrical connectors can comprise wirebonds or other suitable members for electrically connecting LEDs 25 to first and second conductive traces 34 and 33.

LED device 10 can further comprise an indicator sign or symbol for denoting the electrical polarity for a given side of LED device 10. For example, a first symbol 22 can comprise a "+" sign denoting the side of LED device 10 comprising the positive electrode terminal. A second symbol 23 can comprise a "−" sign denoting the side of LED device 10 comprising the negative electrode terminal. One or more test points 15 can be located adjacent either a positive or negative side of the device for testing the electrical and/or thermal properties of the LED device 10. In one aspect, test point 15 can be disposed adjacent the negative side, or terminal of LED device 10.

Figure 2:
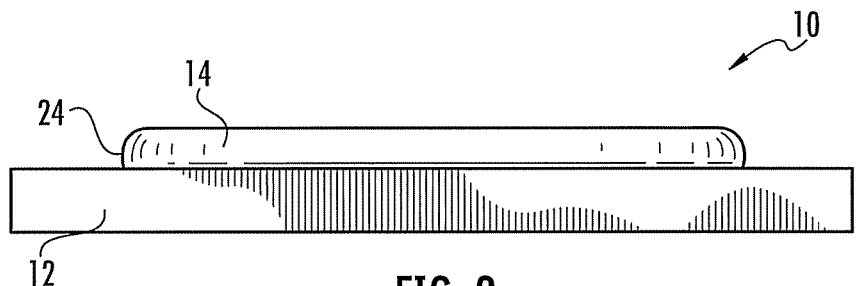
FIG. 2 illustrates a side view of an embodiment of a light emitting device according to the disclosure herein.

FIG. 2 illustrates a side view of LED device 10. As illustrated by FIGS. 1 and 2, retention material 14 can comprise a substantially circular dam disposed about at least a portion of emission area 16 and disposed over substrate 12. Retention material 14 can be dispensed, positioned or otherwise placed over substrate 12 and can comprise any suitable size and/or shape. Retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can be dispensed or deposited in place using an automated dispensing machine where any suitable size and/or shape of dam can be formed. In one aspect, a circular shape as shown can be dispensed, although any other configuration could also be provided such as, for example, a rectangular configuration, a curved configuration and/or any combination of desired configurations and cross-sectional shapes. As FIG. 2 illustrates in a side view of LED device 10, retention material 14 can comprise a rounded outer wall 24 such that the upper surface of retention material 14 opposite substrate 12 is rounded. Rounding, or curving outer wall 24 of retention material 14 may further improve the amount of light reflected by LED device 10.

Figure 3A:
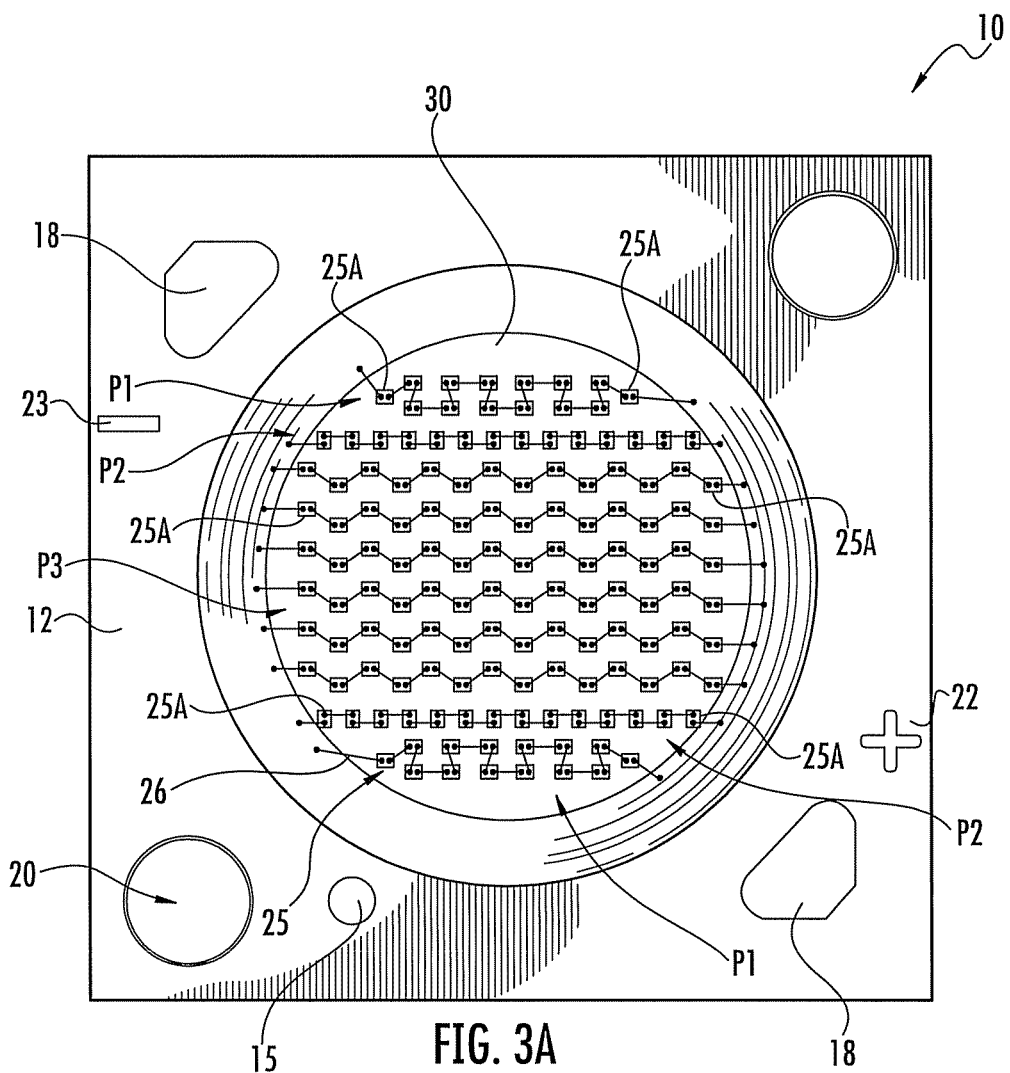
FIGS. 3A and 3B illustrate top views of an embodiment of a light emitting device having one or more patterns of light emitting diodes (LEDs) according to the disclosure herein.
Figure 3B:
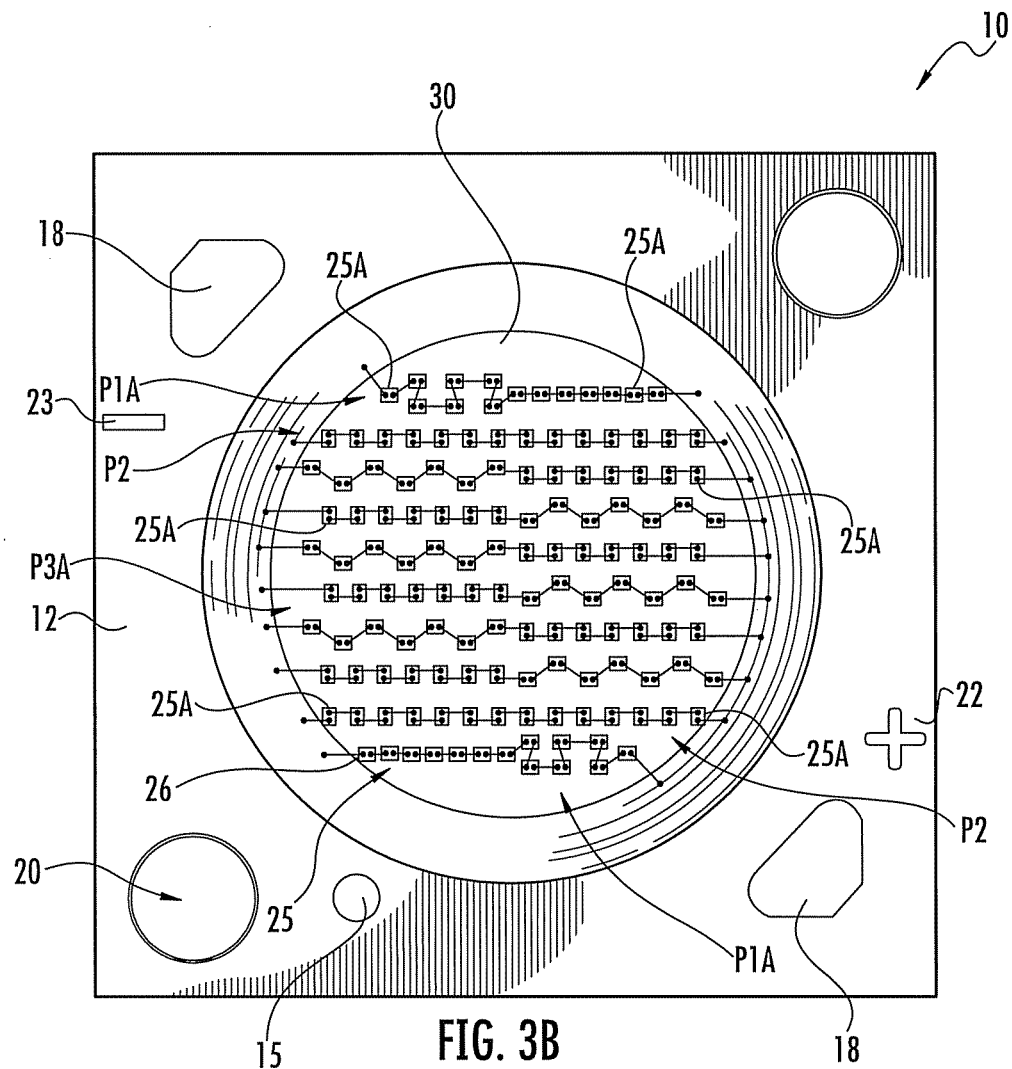

Retention material 14 can comprise any material known in the art, for example, a silicone material comprising 7% fumed silica+3% $TiO_2$+methyl silicone. As illustrated in FIGS. 3A and 3B, retention material 14 can be dispensed after wirebonding of the one or more LEDs 25 such that retention material 14 is disposed over and at least partially covers wirebonds 26 to contain at least a portion, such as one end of each of wirebonds 26 within retention material 14. In FIGS. 3A and 3B, wirebonds 26 for the first and last, or outermost edge LEDs 25A for a given set of LEDs such as LEDs 25 are disposed within retention material 14. In one aspect, retention material 14 can be "planed" during dispersion at room temperature for accurate volume and/or height control. The addition of $TiO_2$ can increase reflection about the emission area 16 to further to optimize light emission of LED device 10. Fumed silica can be added as a thixotropic agent. Dispersing retention material 14 can allow increased board space and the ability to withstand higher voltages. In some aspects, LED device 10 can be operable at 42 volts (V) or higher.

Figure 4:
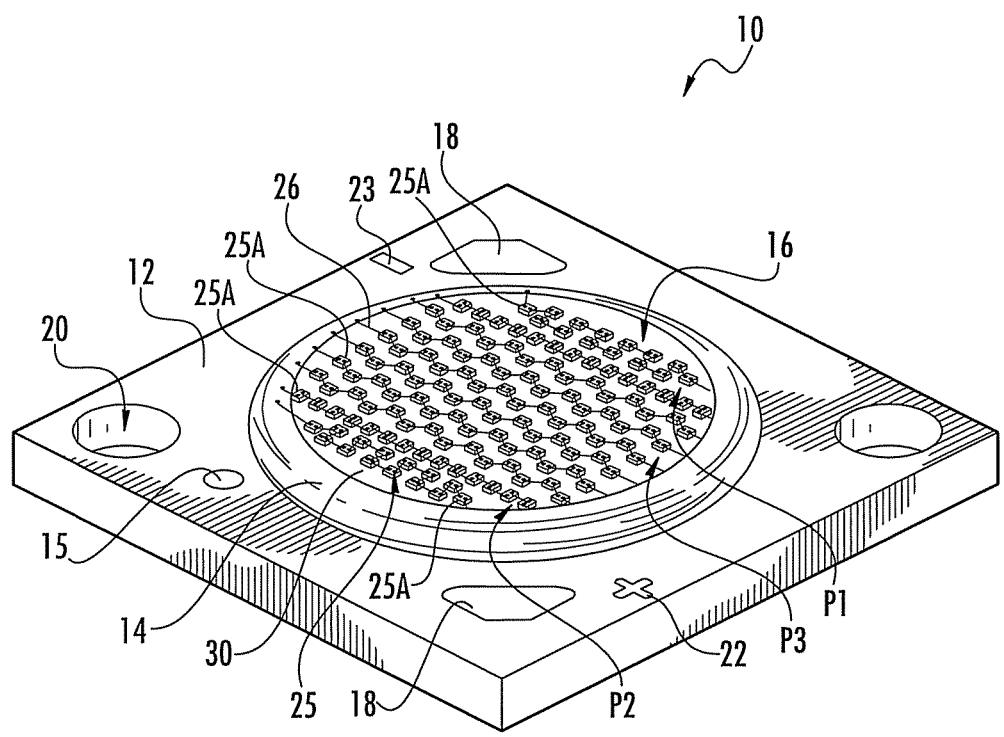
FIG. 4 illustrates a top perspective view of an embodiment of a light emitting device having one or more patterns of LEDs according to the disclosure herein.

FIGS. 3A, 3B and 4 illustrate emission area 16 without a layer of filling material 40. FIGS. 3A and 3B illustrate LED device 10 and emission area 16 comprising at least one pattern, or arrangement, of LEDs. LEDs 25 can be arranged, disposed, or mounted over a conducting pad 30. LEDs 25 can be arranged or disposed in sets of LEDs, that can comprise one or more strings or LEDs, and a given set of LEDs can for example be one or more strings of LEDs electrically connected in series or any other suitable configuration. More than one set of LEDs can be provided, and each set of LEDs can be arranged in parallel to one or more other sets of LEDs. As described further herein, the LEDs in any given set or string of LEDs can be arranged in any suitable pattern or configuration, and even LEDs within a given set or string of LEDs can be arranged or disposed in one or more different patterns or configurations. For example, FIG. 3A illustrates at least there sets of LEDs arranged in three patterns, for example, a first pattern P1, a second pattern P2, and a third pattern P3. Each of patterns P1, P2, and P3 can comprise a consistent pattern design across emission area 16. More than one of patterns P1, P2, and/or P3 can be used. Each of patterns P1, P2, and/or P3 can alternate or be arranged in any suitable configuration. For illustration purposes, only three patterns are illustrated. Any number of patterns or arrangements is contemplated, and patterns can comprise any suitable design, for example, a checkerboard design or a grid design or arrangement wherein the LEDs can be at least substantially aligned in at least two directions. FIG. 3B illustrates at least three sets of LEDs arranged in patterns, for example, a first pattern P1A, second pattern P2, and a third pattern P3A which combine one or more of patterns P1, P2, and P3 illustrated in FIG. 3A. For example, patterns P1A and P3A can comprise a combination of more than one pattern. In one aspect, pattern P1A can comprise a grid arrangement or pattern and a straight line arrangement or pattern. In one aspect, pattern P3A can comprise the checkerboard and straight line pattern designs. Each of patterns P1A and P3A can comprise 14 LEDs 25, seven LEDs of each pattern design. For illustration purposes, only two combinations are illustrated. However, please note that each set of LEDs can comprise a combination of having more than two patterns.

Still referring to FIGS. 3A and 3B, conducting pad 30 can be electrically and/or thermally conducting and can comprise any suitable electrically and/or thermally conducting material. In one aspect, conducting pad 30 can comprise a conductive metal. In one aspect shown in FIG. 3A, emission area 16 can comprise one or more LEDs 25 arranged in a single pattern over conducting surface, or pad 30. In an alternative, LEDs can be provided that are a combination of more than one pattern of LEDs, such as LEDs 25, arranged over conducting pad 30 as FIG. 3B illustrates. As noted above, emission area 16 can comprise a combination of different arrangements or patterns, for example, a combination of first pattern P1, second pattern P2 and/or third pattern P3 for optimizing light emission and device brightness. Each set, or string of LEDs 25 disposed over conducting pad 30 can comprise outermost LEDs 25A with one or more LEDs 25 disposed therebetween. Each string of LEDs 25 can comprise the same or a different pattern, for example, patterns P1, P2, and/or P3. Strings of LEDs 25 can comprise diodes of the same and/or different colors, or wavelength bins, and different colors of phosphors can be used in the filling material 40 (FIG. 7) disposed over LEDS 25 that are the same or different colors in order to achieve emitted light of a desired wavelength. The one or more patterns of LEDs 25 can comprise an array of LEDs within emission area 16.

FIGS. 3A, 3B, and 4 illustrate emission area 16 comprising, for example, 10 lines, or strings, of LEDs 25. Each string of LEDs 25 can comprise any suitable number of LEDs electrically connected between outermost LEDs 25A which can connect to respective electrical elements. In one aspect, each string of LEDs 25 can comprise at least 14 LEDs. In one aspect, LED device can comprise at least 140 LEDs arranged in an array. The arrangements, patterns, and/or combination of multiple patterns herein can comprise an array for optimizing color uniformity and brightness of light emitted from LED device 10. The LEDs can be electrically connected in series using one or more wirebonds 26 for attaching bond pads of adjacent LEDs 25. In one aspect as shown in FIG. 3A, first pattern P1 can comprise the first and tenth strings of 14 LEDs 25. First pattern P1 can comprise two opposing lines of LEDs 25 disposed between the first and last, or outermost LEDs 25A of the series. In one aspect, first pattern P1 comprises what is referred to herein as a grid arrangement, pattern or design, where at least two LEDs are at least substantially aligned in at least two directions and can include single, unaligned LEDs at opposing ends of a set or string of LEDs. Each of the LEDs 25 comprising first pattern P1 can be electrically connected in series. In one aspect, second arrangement or second pattern P2 can be disposed adjacent first pattern P1, for example, located at the second and ninth strings of LEDs 25. In one aspect, second pattern P2 can comprise 14 total LEDs 25 wherein each of the 14 LEDs 25 can be arranged adjacent each other along a horizontal line in a straight line design, or arrangement, and each of the 14 LEDs 25 can be electrically connected in series. Any suitable number of LEDs 25 can be connected in any suitable configuration or arrangement such as in series to form a string having a suitable pattern. Care must be taken when connecting LEDs 25 in series such that the positive or negative electrode of a preceding LED electrically connects to an electrode of opposite electrical polarity for a subsequent LED for allowing electrical current to flow properly through the string of LEDs 25.

Third pattern P3 shown in FIG. 3A can comprise a checkerboard pattern having a checkerboard design, or arrangement of LEDs 25 electrically connected in series. In one aspect, at least 14 LEDs 25 can comprise the checkerboard pattern, and third pattern P3 can be disposed between and/or alternate with strings of LEDs having second pattern P2. The checkerboard pattern or third pattern P3 can comprise a set of LEDs 25 alternating both above and below a horizontal line. Patterns P1, P2, and P3 are not limited in the shape of pattern or to at least 14 LEDs, but rather, patterns can comprise any suitable arrangement and any suitable number of LEDs 25. For illustration purposes, only three patterns are shown although any suitable number of patterns could be utilized. The alternating LEDs 25 of third pattern P3 can optimize light output by ensuring uniform coverage and spatial alignment over conducting pad 30 such that light emission is uniform and improved. Third pattern P3 can repeat from the third through the eighth string of LEDs 25. First and last LEDs 25A in a given string of LEDs 25 for each of patterns P1, P2, and/or P3 can electrically connect to first and second conductive traces 33 and 34 (see FIGS. 7, 8) for receiving and transmitting electrical current or signal through and illuminating a given string of LEDs 25.

The LEDs even in a single set or string in emission area 16 can comprise LEDs in more than one pattern or configuration. For example, FIG. 3B illustrates one aspect of a possible arrangement of LEDs in emission area 16 where there are at least two sets, shown here as strings without limitation, of LEDs 25 and where LEDs 25 for some sets or strings are arranged in different patterns or configurations with respect to another set or string of LEDs and even within one single set or string of LEDs. Any two given separate sets or strings of LEDs 25 can be electrically connected in a pattern such that some or all of the LEDs within each of the two sets or strings of LEDs can be arranged in different patterns, in identical patterns, or in any combination of patterns. In other words, the LEDs in any given set or string can be disposed in different or identical patterns with respect not only to the LEDs in that set or string but can also be disposed in any pattern with respect to another set or string of LEDs and the two sets or strings can in one aspect be parallel to one another. For example, LEDs 25 in FIG. 3B can be disposed in one aspect such that emission area 16 comprises a combination of different arrangements or patterns, for example, a first pattern P1A, a second pattern P2A and/or a third pattern P3A for optimizing light emission and device brightness. As noted earlier, patterns P1A and P3A illustrate a combination of two different patterns, for example at least two of the checkerboard, straight line and/or grid arrangement, however, combinations of more than two patterns is hereby contemplated. Only three pattern arrangements have been disclosed (i.e., checkerboard, grid, straight line), but any suitable arrangement or pattern design can be used. Each string of LEDs 25 disposed over conducting pad 30 can comprise outermost LEDs 25A with one or more LEDs 25 disposed therebetween. Each set or string of LEDs 25 can comprise the same or a different pattern, for example, patterns P1A, P2A, and/or P3A. Sets or strings of LEDs 25 can comprise diodes of the same and/or different colors, or wavelength bins, and different colors of phosphors can be used in the filling material 40 (FIG. 7) disposed over LEDS 25 that are the same or different colors in order to achieve emitted light of a desired wavelength. The one or more patterns of LEDs 25 can comprise an array of LEDs within emission area 16. As FIG. 3B illustrates, for example, in pattern P3A, sets of LEDS 25 can comprise rectangular LEDs arranged where the major (i.e., long) axis of a first LED is disposed in a different orientation than the major axis of at least a second LED. That is, a given set of LEDs 25 can comprise LEDs 25 in different orientations. In other aspects, as illustrated in FIG. 3A for example, pattern P2 and pattern P3 can comprise sets of rectangular LEDs 25 where the major axis is the same is the same for the given set but different from the orientation of other sets.

The various LED arrangements and device designs as described herein are advantageous for providing a light emitting device with excellent performance and output while still being a small light emitting device where pressure exists to provide small devices while maintaining quality performance and light output.

Figure 5:
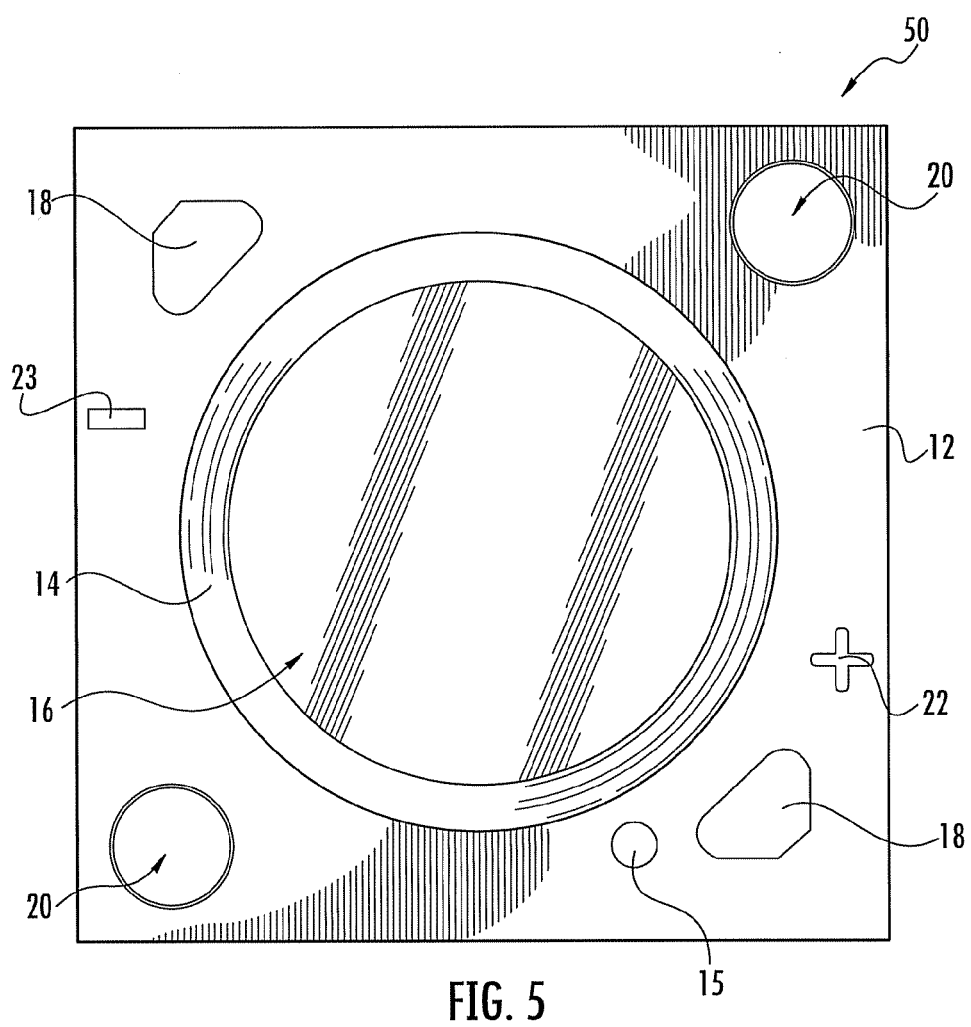
FIG. 5 illustrates a top view of an embodiment of a light emitting device according to the disclosure herein.

FIG. 5 illustrates a second embodiment of an LED device, generally designated 50 which is similar in form and function to LED device 10. LED device 50 can comprise substrate 12 and emission area 16 disposed over substrate 12. Emission area 16 can comprise any suitable size, shape, number and/or be disposed at any suitable location over substrate 12. Retention material 14 can be disposed over substrate 12 and at least partially about emission area 16. LED device 50 can comprise one or more openings or holes 20, disposed through substrate 12 for facilitating attachment of LED device 10 to an external substrate or surface. LED device 50 can comprise first and second symbols 22 and 23 for denoting the electrical polarity of LED device 50. LED device 50 illustrates test point 15 disposed adjacent the positive or side of the device for testing the electrical and/or thermal properties of the LED device 50. LED device 50 further can comprise at least one electrical attachment surface 18 that can electrically connect to one or more external wires (not shown) for facilitating the flow of electric current into emission area 16 of LED device 50. In one aspect, attachment surface 18 can comprise a shape having curved corners. Rounding the corners, or edges of attachment surfaces 18 may better contain the flow of solder over the device than sharp corners when attaching one or more external conductive wires (not shown) to LED device 50.

FIG. 6 illustrates a portion of a cross-section along an edge of conducting pad 30 of FIGS. 3A and 3B wherein the emission area 16 has not been filled with filling material 40 such as encapsulant and/or phosphors. FIG. 6 illustrates LEDs 25 comprising an outermost LED 25A and adjacent LED for a given string of LEDs within emission area 16. FIG. 7 illustrates a portion of a cross-section of FIG. 1 wherein filling material 40 is disposed over emission area 16. For illustration purposes, only four LEDs 25 are illustrated and electrically connected in series in FIG. 7. However, as noted earlier, each string, or pattern of LEDs 25 can comprise any suitable number of LEDs 25. In one aspect, each string of LEDs can comprise 14 LEDs 25. FIGS. 6 and 7 illustrate one or more LEDs 25 connected in series by one or more wirebonds 26. LEDs 25 can be arranged over conducting pad 30 and can thermally communicate directly with conducting pad 30 or indirectly through one or more intervening layers. LEDs 25 can attach to conducting pad 30 or intervening layers using any attachment means known in art. In one aspect, LEDs 25 can attach using solder pastes, epoxies, or flux. Conducting pad 30 can be formed integral as one piece of substrate 12 or can comprise a separate layer disposed over substrate 12. Conducting pad 30 can dissipate heat generated by the one or more LEDs 25.

As FIGS. 6 and 7 further illustrate, the outermost LEDs 25A for a series, string, or pattern of LEDs 25 can electrically communicate or connect to one or more electrical elements. Electrical elements can comprise first and second conductive traces 33 and 34 configured to flow, or supply electrical signal or current to the respective strings of LEDs 25. One of first and second conductive traces 33 and 34 can comprise an anode and the other a cathode. The electrical polarity can be denoted by first and second symbols 22 and 23 (FIG. 1) as discussed earlier. Conducting pad 30 and conductive traces 33 and 34 can comprise any suitable electrical and thermally conductive materials and can comprise either the same or different materials. In one aspect, conducting pad 30 and conductive traces can comprise a layer of copper (Cu) deposited over substrate using any suitable technique. An electrically insulating solder mask 32 can be disposed at least partially between conducting pad 30 and respective conductive traces 33 and 34 such that when solder is used to attach one or more LEDs 25 over conducting pad 30, the solder cannot electrically connect with the conductive traces 33 and 34 thereby causing one or more strings of LEDs 25 to become electrically shorted.

FIG. 6 illustrates various placement areas, positions, or locations of retention material 14 about emission area 16. In one aspect, retention material 14 can be dispensed about at least a portion, or entirely about emission area 16. Conventional devices can comprise a molded as opposed to dispensed dam placed at a location such as prior art location PA shown in broken lines in FIG. 6 and disposed along an edge of where solder mask 32 contacts first conductive trace 34. The present subject matter envisions retention material 14 disposed in areas, positions, or locations R1, R2, and/or any location therebetween. When retention material 14 is disposed in locations R1 or R2, it can be disposed over and cover at least a portion of one or more wirebonds 26 connecting outermost LEDs 25A to electrical elements, such as conductive trace 34. When in location R1, retention material 14 can be disposed at least partially over each of solder mask 32 and wirebond 26 connected to outermost LED 25A for a respective string of LEDs 25. In one aspect, retention material 14 can be disposed entirely over the portion of solder mask 32 disposed between conducting pad 30 and conductive trace 34 and/or entirely over wirebond 26 when in location R1. In another aspect, retention material 14 can be disposed over and at least partially or entirely cover each of the wirebonds 26 of each of the outermost LEDs 25A for each string of LEDs 25 disposed in emission area 16. The retention material can be dispensed in a predetermined location on the substrate 12 for providing a suitable distance between the retention material 14 and the one or more LEDs 25. Notably, when in location R1, retention material 14 can eliminate the need for solder mask 32 as retention material would be disposed between conducting pad 30 and first and/or second conductive traces 33, 34. Location R2 illustrates retention material 14 disposed at least partially over solder mask 32 and at least partially over wirebond 26 of outermost LED 25A. As illustrated, retention material 14 according to the subject matter herein can comprise a substantially rounded or hemispheric shaped cross-section. Rounding retention material 14 can increase the surface area from which light may be emitted and/or reflected.

FIG. 7 illustrates a string of one or more LEDs 25, for illustration purposes four LEDs 25 are shown but strings of LEDs 25 can comprise any suitable number of LEDs, for example, 14 LEDs 25 arranged in series. FIG. 7 illustrates a cross-section of substrate 12 over which LEDs 25 can be mounted or otherwise arranged. Substrate 12 can comprise, for example, conducting pad 30, first and second conductive traces 33 and 34, and solder mask 32 at least partially disposed between conducting pad 30 and each of conductive traces 33 and/or 34. As noted earlier, if retention material is positioned adjacent outermost LEDs 25A, for example in location R1, solder mask 32 between conducting pad 30 and first and second conductive traces 33 and 34 can be eliminated as it would no longer be necessary. Solder mask 32 can be disposed between conductive traces 33 and 34 and attachment surfaces 18 (FIG. 8), the proximal edges of which can be seen in FIG. 7 adjacent retention material 14, adjacent the outer wall 24 of retention material 14. Substrate 12 can further comprise a dielectric layer 36, and a core layer 38. For illustration purposes, substrate 12 can comprise a MCPCB, for example, those available and manufactured by The Bergquist Company of Chanhassan, Minn. Any suitable substrate 12 can be used, however. Core layer 38 can comprise a conductive metal layer, for example copper or aluminum. Dielectric layer 36 can comprise an electrically insulating but thermally conductive material to assist with heat dissipation through substrate 12. FIG. 7 illustrates retention material 14 arranged, for example, in position R2 at least partially over each of solder mask 32 and the wirebond 26 connecting to conductive traces 33 and 34. FIG. 7 illustrates filling material 40 disposed over the one or more LEDs 25. Filling material 40 can be selectively filled to any suitable level higher, lower, or equal to the height of retention material 14. Wirebonds 26 of the outermost LEDs 25A as shown can be at least partially disposed within retention material 14.

FIG. 7 further illustrates examples of first and second heights H1 and H2 of filling material 40 which can be selectively filled within LED device 10. First height H1 can comprise a height at which filling material 40 is disposed over the LEDs 25. The height may vary due to process variability, so an average height above the string of LEDs 25 can be used and controlled for optimal brightness. Second height H2 can comprise a height at which filling material 40 is selectively disposed over a top surface of conducting pad 30. Second height H2 can be controlled, for example, by controlling the location of retention material 14 and whether it assumes location R1, R2 or any position therebetween. Second height H2 can also be controlled by controlling the amount of filling material 40 dispensed into the cavity defined by retention material 14.

Controlling the volume of filling material 40 within the cavity, or dam defined by retention material 14 can affect first and second heights H1 and/or H2 and can notably allow for fine-tuning, or micro-tuning the color, or wavelength, of light emitted from LED device 10. Micro-tuning the color of LED devices 10 can therefore ideally increase product yields to 100%. For example, the amount of color affecting components, including but not limited to phosphors, contained in filling material 40 can be selectively added and the first and/or second heights H1, H2 can be selectively controlled by under or over filling the filling material 40 within emission area 16 depending on the wavelength of LEDs 25 used within device 10. Location of retention material 14, for example, locating retention material at R1, R2, or any position or distance therebetween can also affect first and/or second heights H1 and H2. Micro-tuning color can be achieved over multiple devices or on a per device, or package, basis by changing, for example the ratio of volume of phosphor to overall dispense capability volume of filling material 40. The ratio of volume of phosphor to overall dispense capability volume of filling material 40 can be adjusted based on the wavelength bin of LEDs 25 selected for use in a given device to attain the desired overall wavelength output of LED device 10. By manipulating, for example, the diameter of the dam provided by retention material 14 and/or the height of retention material 14, each of which can affect heights H1 and/or H2 and therefore the volume of fill material, the color of individual devices 10 can be micro-tuned thereby attaining higher process yields. Notably, selectively controlling a volume of the fill material such that color-affecting components of the fill material can be fine-tuned allows for light produced by the one or more LEDs to fall within a predetermined and precise color range.

FIG. 8 illustrates LED device 10 comprising substrate 12 prior to arranging, dispensing, or otherwise placing retention material 14 about at least a portion of emission area 16. For illustration purposes, only a first string of LEDs 25 is illustrated, however, as noted earlier, emission area can comprise more than one strings of LEDs 25 electrically connected in series. In one aspect, LED device 10 comprises 10 strings of LEDs 25 connected in series. As illustrated, prior to placing retention material 14, substrate 12 can comprise first and second conductive traces 33 and 34 arranged in a substantially circular arrangement about conducting pad 30 such that LEDs arranged over conducting pad 30 can electrically communicate to each trace by wirebonding and wirebonds 26 or by any other suitable attachment method. As illustrated, outermost LEDs 25A for a respective string of LEDs 25 can electrically connect to conductive traces.

At least one gap 42 can exist between conductive traces 33 and 34. LED device 10 and devices disclosed herein can further comprise elements to protect against damage from ESD positioned, or disposed in the gap 42. In one aspect, different elements can be used such as various vertical silicon (Si) Zener diodes, different LEDs arranged reverse biased to LEDs 25, surface mount varistors and lateral Si diodes. In one aspect, at least one Zener diode 44 can be disposed between ends of first and second conductive traces 33 and 34 and reversed biased with respect to the strings of LEDs 25. In one aspect, two Zener diodes 44 can be electrically connected in series using one or more wirebonds 46 between first and second conductive traces 33 and 34 for higher voltage applications. As Zener diodes 44 are typically black and absorb light, placing the at least one Zener diode 44 in gap 42 between conductive traces 33 and 34 and also beneath retention material 14 can further improve light output intensity.

FIG. 8 also illustrates one possible location for conducting pad 30. That is, conducting pad 30 can comprise a substantially centrally located circular pad disposed between conductive traces 33 and 34. Conducting pad 30 however, can be located at any suitable location over substrate and any location other than substantially center the device. Solder mask 32 can be disposed at least partially between respective conductive traces and conducting pad 30, such that the solder mask 32 comprises a substantially circular arrangement about conducting pad 30. Solder mask 32 can also be disposed in areas outside of the conductive traces, for example, between the respective conductive traces and one or more attachment surfaces 18. Broken lines 52 illustrate one possible aspect of the size and/or shape of conducting material comprising the conductive traces 33 and 34. The lines are broken to illustrate how the material can be disposed under solder mask 32. Thus, attachment surfaces 18 electrically and/or thermally communicate with respective conductive traces, and can comprise the same layer of material. External, conductive wires (not shown) can electrically connect to attachment surfaces 18, and electrical current or signal can flow from the attachment surfaces 18 to the respective conductive traces. The electrical current can flow along the conducting material designated by dotted lines 52 disposed below the layer of solder mask 32. The electrical current can flow into and/or out of the conductive traces and therefore into and out of respective strings of LEDs 25 mounted over conducting pad 30.

As noted earlier, Zener diodes 44 are typically black and absorb light. FIG. 9 illustrates Zener diode 44 upon placement of the retention material. In one aspect, retention material 14 can be disposed at least partially over the at least one Zener diode 44. In another aspect, retention material 14 can be disposed entirely over the at least one Zener diode 44 such that the diode is completely covered for further improving light output intensity. Zener diode 44 can be disposed over an electrically and/or thermally conducting surface or area 54 such that current can flow through the diode 44, into the wirebonds 46, and to respective conductive traces 33 and 34.

LED devices disclosed herein can advantageously consume less energy while delivering equal or greater illumination. In one aspect, when used in traditional downlight applications, luminaires based on LED devices 10 and/or 50 can deliver 38% more illumination than a 26-watt CFL or a 100-watt incandescent bulb, while consuming only 14 watts. In one aspect, LED device 10 can enable a 60-watt A-lamp equivalent while consuming only 11 watts. LED device 10 can comprise a light output of 1050 lumens at 11 watts, or 2000 lumens at 27 watts, with a 3000-K warm-white color temperature.

Embodiments of the present disclosure shown in the drawings and described above are exemplary of numerous embodiments that can be made within the scope of the appended claims. It is contemplated that the configurations of LED devices and methods of making the same can comprise numerous configurations other than those specifically disclosed.

What is claimed is:

1. A light emitting device comprising:
    a substrate;
    a plurality of light emitting diodes (LEDs) disposed over the substrate, the LEDs comprising electrical connectors, and wherein at least some of the LEDs are connected in a first pattern that is non-linear; and
    a retention material disposed over the substrate, wherein the retention material is disposed over at least a portion of the electrical connectors.

2. The light emitting device of claim 1 wherein the retention material is dispensed on the substrate.

3. The light emitting device of claim 1 wherein an upper surface of the retention material opposite the substrate has a curved cross section.

4. The light emitting device of claim 1 further comprising at least one electrostatic discharge device (ESD) and wherein the ESD is at least partially covered by the retention material.

5. The light emitting device of claim 1 wherein at least some of the LEDs are arranged in a checkerboard configuration.

6. The light emitting device of claim 5 wherein the plurality of LEDs are disposed in a plurality of strings each comprising four or more LEDs.

7. The light emitting device of claim 6 wherein there are at least 14 LEDs disposed in each string and a total of at least 140 LEDs.

8. The light emitting device of claim 1 wherein the electrical connectors comprise wirebonds.

9. The light emitting device of claim 1 wherein the substrate comprises one or more intervening layers disposed between the retention material and the substrate.

10. A light emitting device comprising:
    a substrate;
    at least one conductive trace electrically connected with the substrate;
    an array of LEDs electrically connected with the at least one conductive trace, wherein the array of LEDs comprises at least one set of LEDs connected in a first pattern that is non-linear; and
    a retention material disposed over the substrate, wherein the retention material is disposed about the array of LEDs.

11. The light emitting device of claim 10 wherein the retention material retains a fill material at least partially disposed over the array of LEDs.

12. The light emitting device of claim 11 wherein the fill material at least partially comprises a phosphor or other material for affecting a color of light emitted from the array of LEDs.

13. The light emitting device of claim 10 wherein the retention material is disposed over at least a portion of each of the at least one conductive trace and a solder mask, the solder mask at least partially disposed over a portion of the substrate.

14. The light emitting device of claim 10 wherein the retention material is disposed over at least a portion of the at least one conductive trace to which at least a first LED of the array of LEDs is electrically connected.

15. The light emitting device of claim 10 further comprising one or more attachment surfaces on an upper surface of substrate for electrically connecting the light emitting device to an external power source, wherein the attachment surfaces are disposed adjacent to the retention material.

16. The light emitting device of claim 15 wherein the attachment surfaces comprise solder contacts.

17. The light emitting device of claim 10 wherein the substrate comprises one or more intervening layers disposed between the retention material and the substrate.

18. A light emitting device comprising:
    a substrate comprising a metal core layer, a dielectric layer disposed over the core layer, and a metallic trace disposed over the dielectric layer;
    two or more strings of light emitting diodes (LEDs) disposed over the substrate, each string comprising a plurality of LEDs electrical connected in series; and
    a circular shaped retention material disposed over the substrate and at least partially around the two or more strings of LEDs.

19. A light emitting device, comprising:
    a substrate;
    a first plurality of light emitting diodes (LEDs) disposed over the substrate in a first pattern;
    a second plurality of LEDs disposed over the substrate in a second pattern; and wherein the first pattern is different from the second pattern.

20. The light emitting device of claim 19 further comprising a retention material disposed on the substrate at least partially disposed around the first and second patterns.

21. The light emitting device of claim 20, wherein the LEDs comprise electrical connectors and wherein the retention material is disposed over at least a portion of the electrical connectors.

22. The light emitting device of claim 21 wherein the electrical connectors comprise wirebonds.

23. The light emitting device of claim 19, wherein at least one of the first or second pluralities of LEDs comprises LEDs electrically connected in series.

24. The light emitting device of claim 19, wherein the first and second patterns comprise at least two of the following arrangements:
(i) a checkerboard arrangement;
(ii) a straight line arrangement; and
(iii) a grid arrangement wherein the LEDs are substantially aligned in at least two directions.

25. The light emitting device of claim 24, wherein the first and second patterns comprise a combination of any two of the checkerboard, straight line, or grid arrangements.

26. The light emitting device of claim 19 further comprising a third plurality of LEDs disposed over the substrate in a third pattern that is different from the first and second patterns.

27. The light emitting device of claim 26, wherein the first plurality comprises a first set of LEDs, the second plurality comprises a second set of LEDs, and the third plurality comprises a third set of LEDs, and wherein each set of LEDs is disposed over the substrate.

28. The light emitting device of claim 19, wherein the LEDs of at least one of the first and second plurality of LEDs are arranged in different arrangements over the substrate.

29. The light emitting device of claim 28, wherein the first plurality of LEDs comprise LEDs arranged in parallel with LEDs of the second plurality of LEDs.

30. The light emitting device of claim 19, wherein the first plurality of LEDs comprises rectangular LEDs in a first orientation and the second plurality of LEDs comprises rectangular LEDs in a second orientation different from the first orientation.

31. The light emitting device of claim 19, wherein at least a first LED of the first plurality of LEDs comprises a rectangular LED in a first orientation and at least a second LED of the first plurality of LEDs comprises a rectangular LED in a second orientation different from the first orientation.

32. The light emitting device of claim 1, wherein at least some of the LEDs are serially connected.

33. The light emitting device of claim 10, wherein the at least one set of LEDs are serially connected.

* * * * *